(12) United States Patent
Wei et al.

(10) Patent No.: US 11,789,083 B2
(45) Date of Patent: Oct. 17, 2023

(54) INTELLIGENT BATTERY AND STATE-OF-CHARGE ONLINE ESTIMATION METHOD AND APPLICATIONS THEREOF

(71) Applicant: Beijing Institute of Technology, Beijing (CN)

(72) Inventors: Zhongbao Wei, Beijing (CN); Hongwen He, Beijing (CN); Jian Hu, Beijing (CN)

(73) Assignee: Beijing Institute of Technology, Beijing (CN)

( * ) Notice: Subject to any disclaimer, the term of this patent is extended or adjusted under 35 U.S.C. 154(b) by 207 days.

(21) Appl. No.: 17/398,004

(22) Filed: Aug. 10, 2021

(65) Prior Publication Data

US 2021/0364574 A1 Nov. 25, 2021

(30) Foreign Application Priority Data

Nov. 6, 2020 (CN) .......................... 202011235376.2

(51) Int. Cl.
| | |
|---|---|
| *G01R 31/367* | (2019.01) |
| *G01R 31/3842* | (2019.01) |
| *G01R 31/374* | (2019.01) |
| *H01M 10/42* | (2006.01) |
| *H01M 10/48* | (2006.01) |

(52) U.S. Cl.
CPC ......... *G01R 31/367* (2019.01); *G01R 31/374* (2019.01); *G01R 31/3842* (2019.01); *H01M 10/4257* (2013.01); *H01M 10/486* (2013.01); *H01M 2010/4271* (2013.01); *H01M 2220/20* (2013.01)

(58) Field of Classification Search
None
See application file for complete search history.

(56) References Cited

U.S. PATENT DOCUMENTS 9,157,966 B2 * 10/2015 Papana ................ G01R 31/389

OTHER PUBLICATIONS

Balasingam, B.; Ahmed, M.; Pattipati, K. Battery Management Systems—Challenges and Some Solutions. Energies 2020, 13, 2825, (Year: 2020).*

* cited by examiner

*Primary Examiner* — Roy Y Yi

(57) ABSTRACT

A state-of-charge (SOC) online estimation method of an intelligent battery includes steps of performing online estimation on the SOC based on a real-time estimation model, wherein the real-time estimation model is based on an equivalent circuit model, and then obtaining online estimates of the SOC through the SOC-OCV (open circuit voltage) relationship, the current-voltage relationship under different working conditions, and the current terminal voltage and temperature of the intelligent battery. The intelligent battery that is able to apply the SOC online estimation method includes a battery cell and a cell management unit, wherein the cell management unit includes a sensor module, a switching device, a controller module, a communication module and a printed circuit board (PCB), the sensor module includes a voltage sensor and a temperature sensor; the voltage sensor, the temperature sensor, the switching device, the controller module and the communication module are integrated on the PCB.

7 Claims, 5 Drawing Sheets

INTELLIGENT BATTERY AND STATE-OF-CHARGE ONLINE ESTIMATION METHOD AND APPLICATIONS THEREOF

CROSS REFERENCE OF RELATED APPLICATION

The present invention claims priority under 35 U.S.C. 119(a-d) to CN 202011235376.2, filed Nov. 6, 2020.

BACKGROUND OF THE PRESENT INVENTION

Field of Invention

The present invention relates to the field of intelligent cells.

Description of Related Arts

The traditional power battery system realizes the expected output voltage and power through series-parallel connection, and its battery management system (BMS) mostly adopts master-slave topology results. This power battery system has poor flexibility, its performance is often restricted by the weakest cell, so its efficiency is low; at the same time, its communication wiring is complex, it is unable to realize accurate monitoring and control of each cell, and its security and reliability are also insufficient.

In contrast, intelligent battery cells are able to realize accurate monitoring, protection and control at the cell level by integrating multiple sensors, and are able to realize free access and exit of monomers through integrated switching devices, so as to realize real-time self-reconfiguration of battery system, which is expected to greatly improve the overall performance of the power battery system.

However, in the prior art, intelligent cells generally need to integrate current sensors, voltage sensors, temperature sensors, switching devices, communication modules, etc., with high integration, high cost, and obvious temperature rise effects during use. In addition, due to space limitation, shunts are basically used to measure current, the sensor itself consumes part of the electrical energy. More importantly, the accuracy of the sensor will be severely affected under a wide temperature range and electromagnetic interference, resulting in current measurement results with significant errors, and it is easy to directly lead to the weakening or even failure of many battery management functions.

The state of charge (SOC) estimation used in the prior art mostly adopts the Ampere hour integration method and the model-based closed-loop estimation method, such as Kalman filter method, sliding mode state observer and particle filter method. These types of methods require high accuracy of the current measurement value. If a large current measurement error occurs, it will directly lead to inaccurate estimation results, and then cause serious security problems.

Intelligent battery cells in the prior art need to be improved in terms of cost, thermal characteristics and reliability. At the same time, the accuracy of their current measurement and/or the accuracy and stability of their SOC estimation based on current measurement also need to be improved.

Aiming at the improvement of the accuracy of SOC estimation, one solution is to use the parameter identification and SOC estimation method with noise immunity characteristics to compensate the noise effect by real-time estimation of the current and voltage measurement noise statistical characteristics, so as to achieve a more accurate SOC estimation. However, this method has a poor suppression effect on the low-frequency drift error in the measurement, and still needs the current sensor, which is unable to solve the problems of high cost, temperature rise and energy consumption, and is difficult to ensure the stability of the results. Another solution is not to use the current sensor, but to perform analytical calculations based on equivalent circuit models or use filtering algorithms, so as to achieve real-time estimation of current and SOC. However, this method is based on a variety of assumptions and requires priori knowledge of statistical characteristics of system noise, wherein scenes such as high-rate charging and discharging and strong noise easily cause the decrease in the accuracy of SOC estimation.

SUMMARY OF THE PRESENT INVENTION

An object of the present invention is to overcome the shortcomings of the prior art and provide a method which is able to accurately and stably real-time estimate the SOC of an intelligent battery without depending on current measurement. The method has excellent robustness.

Another object of the present invention is to provide an application of the above-mentioned method.

Another object of the present invention is to provide an intelligent battery which adopts the above estimation method, wherein no current sensor is included in the intelligent battery, which effectively reduces the complexity of the battery management unit of the intelligent battery, reduces cost, improves efficiency, and provides sufficient energy utilization through the battery cell.

Accordingly, the present invention provides technical solutions as follows.

A state-of-charge (SOC) online estimation method of an intelligent battery comprises steps of performing online estimation on SOC based on a real-time estimation model, wherein the real-time estimation model is based on an equivalent circuit model with undetermined parameters, and then obtaining online estimates of the SOC through SOC-OCV (open circuit voltage) relationship, current-voltage relationship under different working conditions, and a current battery terminal voltage and a current battery temperature.

Preferably, the working conditions are the SOC, the battery temperature and the battery aging state.

Preferably, constructing the real-time estimation model comprises:
  obtaining the equivalent circuit model with the undetermined parameters of the intelligent battery;
  obtaining the SOC-OCV relationship of the intelligent battery;
  obtaining the current-voltage relationship of the intelligent battery under the different working conditions;
  based on the SOC-OCV relationship and the current-voltage relationship, obtaining a mapping relationship between the undetermined parameters and the battery working conditions of the intelligent battery;
  based on the mapping relationship, obtaining an equivalent circuit model with calibrated parameters after fitting; and
  based on the equivalent circuit model with calibrated parameters, according to the current battery terminal voltage and the current battery temperature, through a joint estimation of state space equation and rolling time domain optimization, obtaining real-time estimates of the SOC.

Preferably, the fitting is achieved by a batch least squares optimization method.

Preferably, the equivalent circuit model with the undetermined parameters of the intelligent battery is first-order RC (resistor-capacitor) model, second-order RC model, internal resistance equivalent model, Partnership for a New Generation of Vehicles (PNGV) model or electrochemical model.

More preferably, the equivalent circuit model with the undetermined parameters of the intelligent battery is the first-order RC model which is expressed by formulas of:

$$C_p dV_p(t)/dt + V_p(t)/R_p = I_L(t)$$

$$V_t(t) = V_{oc}(t) - V_p(t) - I_L(t)R_o$$

$$dz(t)/dt = -\eta I_L/C_n,$$

here, t represents time, $I_L$ represents load current, $I_L(t)$ represents load current at time t, $V_p$ represents polarization voltage, $V_p(t)$ represents polarization voltage at time t, $V_t$ represents terminal voltage, and $V_t(t)$ represents terminal voltage at time t, $\eta$ represents Coulomb efficiency of intelligent battery, $C_n$ represents rated capacity of intelligent battery, $R_o$, $R_p$, and $C_p$ respectively represent ohmic internal resistance parameter, polarization resistance parameter and polarization capacitance parameter to be determined, $V_{oc}$ represents open circuit voltage of intelligent battery OCV, $V_{oc}(t)$ represents OCV of intelligent battery at time t, z represents SOC of intelligent battery, and then dz (t)/dt represents derivative of SOC of intelligent battery with respect to time.

Preferably, the SOC-OCV relationship is obtained by measuring a battery terminal voltage in different charging and discharging stages, taking the battery terminal voltage as an OCV in different charging and discharging stages, matching the OCV with a SOC of the intelligent battery at a same time obtained by Ampere hour integration method, respectively obtaining SOC-OCV data during charging and SOC-OCV data during discharging, so that based on the SOC-OCV data during charging and the SOC-OCV data during discharging, or averaged SOC-OCV data during charging or averaged SOC-OCV data during discharging, the SOC-OCV relationship is obtained through fitting.

Preferably, the fitting is polynomial fitting, Gaussian function fitting or Lorenz function fitting.

More preferably, the fitting is polynomial fitting.

Preferably, at least one of the current-voltage relationship and the mapping relationship between the undetermined parameters and the battery working conditions of the intelligent battery is obtained by a hybrid pulse power characteristic (HPPC) test of the intelligent battery under different working conditions, wherein the working conditions are the SOC, the battery temperature and the battery aging state.

Preferably, the joint estimation method comprises steps of:

(1) discretizing and transforming the equivalent circuit model with calibrated parameters into state space equations of $$x(k) = Ax(k-1) + BI_L(k-1)$$

$$y(k) = f(z(k)) + V_p(k) + R_o I_L(k)$$

$$A = \begin{pmatrix} e^{-\frac{\Delta t}{R_p C_p}} & 0 \\ 0 & 1 \end{pmatrix},$$

$$B = \left[ \left(1 - e^{-\frac{\Delta t}{R_p C_p}}\right) R_p \quad \frac{\Delta t}{C_n} \right]^T$$

$$f(z(k)) = \sum_{i=0}^{n_P} c_i z^i(k),$$

wherein $x(k) = [V_p(k) \; z(k)]^T$ represents state vector to be estimated at time k, $x(k-1)$ represents state vector to be estimated at time k−1, $y(k) = V_t(k)$ represents system output, $\Delta t$ represents calculated time step of cell management unit, A represents state transition matrix, B represents coefficient matrix of $I_L$, $V_p(k)$ represents polarization voltage at time k, $I_L(k)$ represents load current at time k, $f(z(k))$ represents OCV calculation function, $$\sum_{i=0}^{n_p} c_i z^i(k)$$

represents the SOC-OCV relationship obtained by polynomial fitting;

(2) based on the state space equations, constructing a constrained optimization problem that minimizes a terminal voltage error within a customized time window, and online estimating the SOC and the input current through rolling time domain optimization, wherein the constrained optimization problem and constraint conditions thereof are expressed by formulas of $$\{\hat{\theta}\}_{i=k-n}^{k} = \arg \min_{\{\theta\}_{i=k-n}^{k}} \|\alpha(\hat{x}_{k-n} - \bar{x}_{k-n})\|_2 + \sum_{i=k-n}^{k} |\hat{V}_{t,i} - V_{t,i}|,$$

which is subject to the state space equations, $$\{\hat{\theta}\}_{i=k-n}^{k} = [\hat{\theta}_{k-n} \; \hat{\theta}_{k-n+1} \; \ldots \; \hat{Q}_k]$$

$$\{\hat{x}\}_{i=k-n}^{k} = [\hat{x}_{k-n} \; \hat{x}_{k-n+1} \; \ldots \; \hat{x}_k]$$

$$\bar{x}_{k-n} = A\hat{x}_{k-n-1} + BI_{L,k-n-1}, \alpha = \begin{bmatrix} \alpha_1 & 0 \\ 0 & \alpha_2 \end{bmatrix}$$

here, $V_{t,i}$ represents open circuit terminal voltage measurement value at time i, $\hat{V}_{t,i}$ represents open circuit terminal voltage estimated value at time i, $\hat{x}_{k-n}$ represents state vector estimated value at time k−n, n represents customized rolling time domain window length, superscript "^" represents true quantity estimated value, $|\cdot|_2$ represents 2-norm, $\alpha$ represents weight matrix.

Preferably, 1<n<5.

Preferably, solving the constrained optimization problem comprises converting the constrained optimization problem into an optimization problem without constraints, obtaining an optimization objective function, and solving the optimization objective function.

More preferably, the constrained optimization problem is converted into the optimization problem without constraints by Lagrangian multiplier method.

More Preferably, the optimization objective function is solved by Newton method.

Also, the present invention provides some applications of any SOC online estimation method of the intelligent battery mentioned above, which performs online, real-time SOC estimation on intelligent batteries without current measuring device.

The present invention further provides an intelligent battery that is able to apply the SOC online estimation method. The intelligent battery comprises:

a battery cell and a cell management unit electrically connected with the battery cell, wherein the cell management unit comprises a sensor module, a switching device and a controller module.

Preferably, the battery cell is a lithium ion battery, the cell management unit further comprises a communication module and a printed circuit board (PCB), the sensor module comprises a voltage sensor and a temperature sensor; the voltage sensor, the temperature sensor, the switching device, the controller module and the communication module are integrated on the PCB, the cell management unit is integrated on a top cover of the battery cell and is provided with power by the battery cell.

More preferably, the temperature sensor is thermocouple, thermal resistor, thermistor or fiber Bragg grating sensor.

More preferably, the switching device is a power metal-oxide-semiconductor field-effect transistor (power MOSFET).

Preferably, the communication module is configured to communicate through controller area network (CAN) bus, daisy-chain topology, Sub-GHz, the $4^{th}$ generation communication system (4G), wireless fidelity (Wi-Fi) or ZigBee, and more preferably, is configured to communicate through Sub-GHz, 4G, Wi-Fi or ZigBee.

The present invention has some beneficial effects as follows.

The present invention fully considers the problems of high design complexity, poor thermal characteristics, high cost, and unreliable measurement and estimation of intelligent battery cells, and provides a real-time SOC estimation method of an intelligent battery without current sensor. The method reduces the design complexity, power loss and comprehensive cost. The present invention provides a high-precision and high-robustness SOC online estimation method for the intelligent battery without current sensor.

Through constructing the optimization problem of state space constraints and numerically solving in the rolling window, the present invention realizes the accurate real-time estimation of input current and SOC that does not depend on current measurement, significantly improves the resistance to uncertain measurement of current sensor, and increases the robustness and accuracy of SOC estimation of the intelligent battery.

DETAILED DESCRIPTION OF THE PREFERRED EMBODIMENT

The present invention will be explained in detail in combination with the embodiments and drawings as follows, but it should be understood that the embodiments and drawings are only used to exemplify the present invention, and do not constitute any limitation to the protection scope of the present invention. All reasonable alterations and combinations included in the invention purpose of the present invention fall into the protection scope of the present invention.

Figure 1:
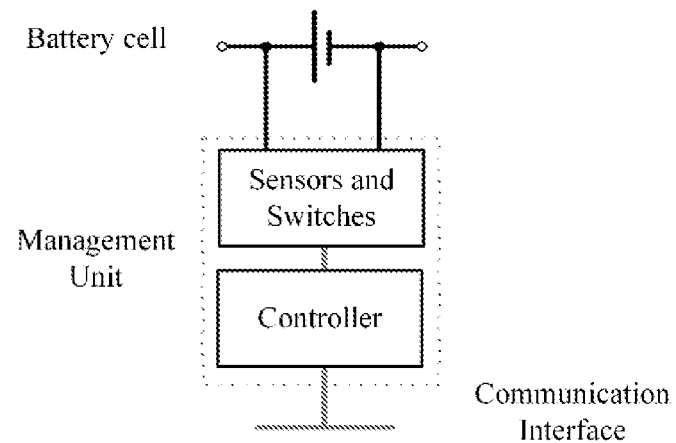
FIG. 1 is a topological structure diagram of an intelligent battery provided by the present invention.

Referring to FIG. 1 of the drawings, an intelligent battery is illustrated, which comprises a battery cell and a cell management unit electrically connected with the battery cell, wherein the cell management unit comprises a sensor module, a switching device and a controller module.

Figure 2:
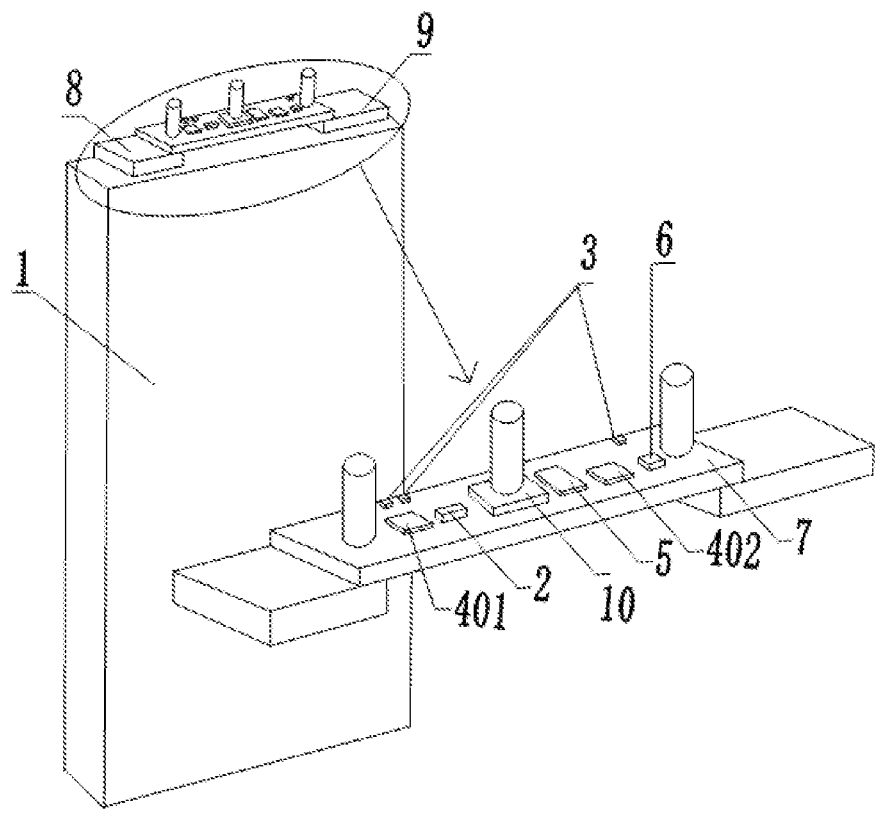
FIG. 2 is an overall structure diagram of the intelligent battery provided by the present invention.

As shown in FIG. 2, the battery cell 1, a voltage sensor 2, a temperature sensor 3, a first switch 401, a second switch 402, the controller module 5, a communication module 6, a printed circuit board (PCB) 7, a cell positive electrode 8, a cell negative electrode 9 and an external positive electrode 10 are illustrated.

Preferably, the battery cell 1 is a square lithium ion battery, the cell management unit further comprises the communication module 6 and the PCB 7, the sensor module comprises the voltage sensor 2 and the temperature sensor 3, the switching device comprises the first switch 401 an the second switch 402; the voltage sensor 2, the temperature sensor 3, the switching device, the controller module 5 and the communication module 6 are integrated on the PCB 7, the cell management unit is integrated on a top cover of the battery cell 1 and is provided with power by the battery cell 1.

Preferably, the temperature sensor is a traditional temperature sensor, such as thermocouple, thermal resistor, thermistor and fiber Bragg grating sensor.

Preferably, the first switch and the second switch are power metal-oxide-semiconductor field-effect transistors (power MOSFETs).

Preferably, the communication module is configured to communicate through controller area network (CAN) bus, daisy-chain topology, Sub-GHz, the $4^{th}$ generation communication system (4G), wireless fidelity (Wi-Fi) or ZigBee, and more preferably, is configured to communicate through Sub-GHz, 4G, Wi-Fi or ZigBee.

Figure 3:
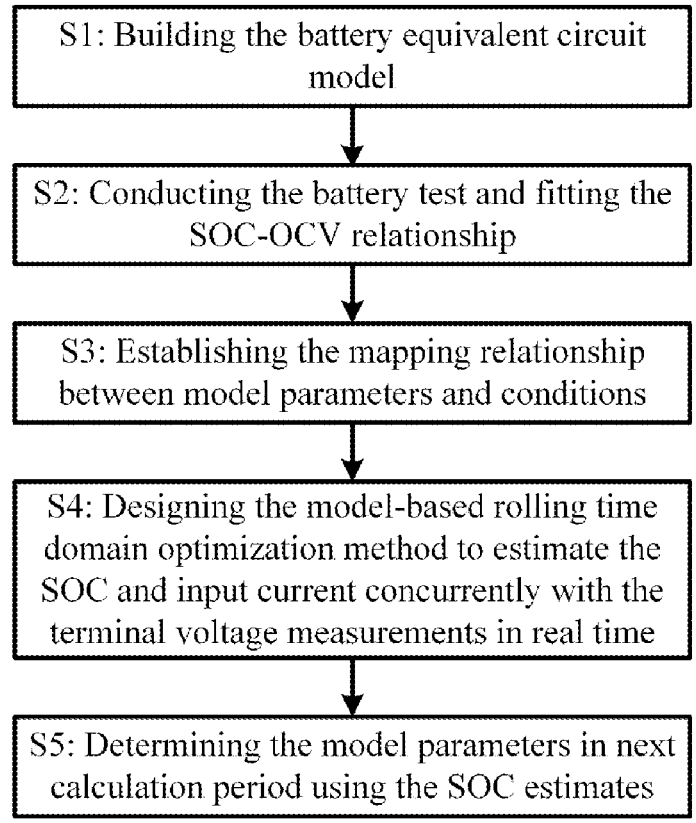
FIG. 3 is a flow chart of constructing a real-time estimation model provided by the present invention.

The SOC of the above intelligent battery is estimated in real time by the SOC online estimation method provided by the present invention, referring to FIG. 3. The process comprises steps as follows.

(A1) Setting up a measuring device for measuring parameters of the intelligent battery at a measuring point, wherein:

the measuring point comprises a surface of the PCB, a surface of the battery cell and an interior of the battery cell;

the measuring device comprises an integrated multiplexed analog-to-digital converter (ADC), wherein an output end of the voltage sensor for measuring a positive voltage and a negative voltage of the battery cell, and an output end of the temperature sensor are connected with two analog-to-digital conversion channels of the ADC, respectively; an output end of a sensor is connected with the controller module of the cell management unit through a serial peripheral interface and the ADC; and preferably, the ADC has at least 12-bit resolution, and a voltage acquisition interval is in a range of 10 ms to 100 ms;

the parameters are a terminal voltage and a surface temperature of the battery cell, and preferably, an interior temperature of the battery cell.

Figure 4:
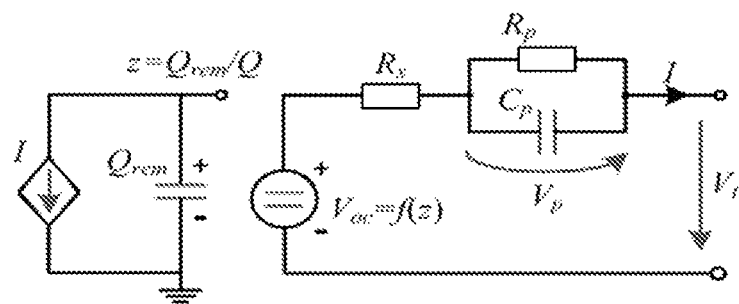
FIG. 4 is a schematic diagram of a first-order equivalent circuit model provided by the present invention.

(A2) Building an equivalent circuit model of the intelligent battery, wherein:

the equivalent circuit model is first-order RC model, second-order RC model, internal resistance equivalent model, Partnership for a New Generation of Vehicles (PNGV) model or other equivalent circuit models or electrochemical models of other forms and orders;

referring to FIG. 4, the equivalent circuit model is first-order RC model which is expressed by formulas of:

$$C_p dV_p(t)/dt + V_p(t)/R_p = I_L(t)$$

$$V_t(t) = V_{oc}(t) - V_p(t) - I_L(t)R_o$$

$$dz(t)/dt = -\eta I_L(t)/C_n,$$

here, t represents time, $I_L$ represents load current, $I_L(t)$ represents load current at time t, $V_p$ represents polarization voltage, $V_p(t)$ represents polarization voltage at time t, $V_t$ represents open circuit terminal voltage, and $V_t(t)$ represents open circuit terminal voltage at time t, $\eta$ represents Coulomb efficiency of intelligent battery, $C_n$ represents rated capacity of intelligent battery, $R_o$, $R_p$ and $C_p$ respectively represent ohmic internal resistance parameter, polarization resistance parameter and polarization capacitance parameter to be determined, $V_{oc}$ represents open circuit voltage of intelligent battery OCV, $V_{oc}(t)$ represents OCV of intelligent battery at time t, z represents SOC of intelligent battery, and then dz(t)/dt represents derivative of intelligent battery SOC with respect to time;

in the first-order RC model, $\eta$, $C_n$, $R_O$, $R_p$ and $C_p$ are obtained by offline experiment calibration, t and $V_t$ are obtained by actual measurement, $I_L$ and $V_p$ as intermediate variables are obtained by estimation.

(A3) Measuring parameters of the intelligent battery in a first measurement procedure with the measuring device, obtaining measurement data, and obtaining a state of charge-open circuit voltage (SOC-OCV) relationship by fitting based on the measurement data. The first measurement procedure comprises:

(A31) firstly charging the intelligent battery till 100% full through constant current and constant voltage (CCCV) charging mode;

(A32) standing the charged intelligent battery still, and then measuring a battery terminal voltage thereof;

(A33) discharging the stood intelligent battery, and obtaining a real-time SOC thereof through Ampere hour integral method during discharging;

(A34) pausing the first discharge and standing still when the real-time SOC drops by 5-10%, and then measuring a battery terminal voltage of the stood intelligent battery and taking the battery terminal voltage as a discharge OCV corresponding to a current 90-95% SOC;

(A35) repeating the steps (A33) to (A34), recording a discharge OCV corresponding to a current SOC every 5-10% SOC till the battery terminal voltage drops to a cut-off voltage, stopping discharging, standing still, measuring a battery terminal voltage after standing, wherein the battery terminal voltage is a discharge OCV corresponding to 0% SOC;

(A36) secondly charging the stood intelligent battery through CCCV, pausing the second discharge till the SOC increases by 5-10%, standing still, measuring a battery terminal voltage after standing, wherein the battery terminal voltage is a discharge OCV corresponding to 5-10% SOC; and (A37) repeating the step (A36), recording the discharge OCV corresponding to the current SOC every 5-10% SOC till the battery terminal voltage meets cut-off conditions, stopping discharging, standing still, measuring a battery terminal voltage after standing, wherein the battery terminal voltage is a discharge OCV corresponding to 100% SOC, wherein:

upper and lower cut-off voltages and CV cut-off current are selected according to a parameter table provided by battery suppliers, the real-time SOC of the intelligent battery obtained by Ampere hour integration method is realized by offline calibration experiments, which is carried out by a mature charge and discharge test system, and does not depend on the sensor of the intelligent battery.

Some specific implementations are as follows, such as obtaining remaining power in the intelligent battery by Coulomb cumulative count, and obtaining SOC by a ratio of the remaining power to a nominal capacity of the intelligent battery.

Preferably, the charging rate in constant current and constant voltage (CCCV) charging is in a range of 0.1-1 C.

Preferably, standing still is performed for 2-5 h each time.

Preferably, the fitting comprises taking the battery terminal voltage obtained by the step (A32) as the discharge OCV corresponding to 100% SOC, taking the battery terminal voltage obtained by the step (A35) as the discharge or charge OCV corresponding to 0% SOC, and taking the battery terminal voltage obtained by the step (A37) as the charge OCV corresponding to 100% SOC.

Through the correspondence between the SOC data and the battery terminal voltages obtained in the above steps of (A31) to (A35), the SOC-OCV data during discharging are obtained.

Through the correspondence between the SOC data and the battery terminal voltages obtained in the above steps of (A36) to (A37), the SOC-OCV data during charging are obtained.

The obtained SOC-OCV data during discharging and the SOC-OCV data during the charging are interpolated and averaged, and then the SOC-OCV relationship is obtained through fitting.

Preferably, the fitting is polynomial fitting model, Gaussian function fitting model or Lorentz function fitting model.

The SOC-OCV relationship is obtained by polynomial fitting as follows.

$$V_{oc} = f(z(k)) = \sum_{i=0}^{n_p} c_i z^i(k),$$

wherein $V_{oc}$ represents OCV of the intelligent; z represents SOC of the intelligent; $n_p$ represents fitting polynomial order, $c_i$ represents fitting coefficient, i represents model order.

Preferably, the model order i is in a range of 4 to 6.

Preferably, the specific value of $c_i$ is obtained through batch least squares optimization method.

(A4) Measuring parameters of the intelligent battery in the second measurement procedure by the measurement device, and obtaining current-voltage response data under different working conditions based on the measurement data.

The second measurement procedure comprises:

(A41) charging the intelligent battery till 100% full through CCCV charging mode;

(A42) standing the charged intelligent battery still;

(A43) measuring current-voltage response data of the intelligent battery by applying hybrid impulse test current to the intelligent battery;

(A44) discharging the intelligent battery at a constant current till the SOC thereof is reduced by 10%, pausing the discharge and standing still; and (A45) repeating the steps of (A43) to (A44) till the battery terminal voltage during constant current discharge process is reduced to the lower cut-off voltage, wherein the upper and lower cut-off voltages and the CV cut-off current are selected according to the parameter table provided by battery suppliers.

Preferably, both the charging rate in CCCV charging and discharging is 0.3 C.

Preferably, standing still is performed for 2 h each time.

Preferably, the current and voltage sampling frequency is not less than 1 Hz.

Preferably, applying the hybrid impulse test current is performed by discharging at 4 C of pulse current for 10 s, standing still for 40 s; and then charging at 4 C of pulse current for 10 s, standing still for 40 s. If the battery terminal voltage exceeds the upper cut-off voltage or decreases to the lower cut-off voltage, the current pulse current is paused immediately, and the next 40 s standing still is performed.

Under different SOCs, battery temperatures and aging states, the above-mentioned second measurement procedure is adopted, respectively, and corresponding current-voltage data under different working conditions are obtained through testing.

Under the aging states, the second measurement procedure specifically comprises:

performing multiple constant current charge and discharge cycles on the intelligent battery, wherein the charging rate is preferably in a range of 1-3 C, and then performing a capacity calibration experiment every certain number of cycles, wherein preferred number of cycles is in a range of 20-50, and calibrating a ratio of an obtained capacity to an initial nominal capacity of the intelligent battery as the current aging state.

The hybrid impulse test described in steps (A41) to (A45) is performed under different aging states to obtain current-voltage curves in different aging states, so that model parameters in the current aging state according to the current-voltage curves.

(A5) Based on the SOC-OCV relationship and the current-voltage response data, the multi-dimensional mapping relationship between the undetermined parameters and the working conditions of the intelligent battery.

The working conditions are the SOC, the battery temperature and the battery aging state.

In the above-mentioned first-order RC model, the undetermined parameters are $R_o$, $R_p$ and $C_p$.

The step (A5) comprises:

(A51) extracting the segment data of the hybrid impulse test under a certain temperature, aging state, and SOC, combining the segment data with the SOC-OCV relationship obtained in the step (A4), and fitting the undetermined parameters $R_o$, $R_p$ and $C_p$ in the first-order RC model by batch least squares multiplier method; and (A52) based on the identification results of the parameters $R_o$, $R_p$ and $C_p$ obtained under various conditions, making a multi-dimensional mapping table among each model parameter and temperature, aging state, and SOC.

(A6) Based on the equivalent circuit model with calibrated parameters, obtaining real-time estimates of the SOC by real-time battery terminal voltage and battery temperature with SOC real-time estimation model.

The SOC real-time estimation model is preferably a joint estimation model based on state space equations and rolling time domain optimization.

The step (A6) comprises:

(A61) Based on the measured battery terminal voltage and battery working condition at the current moment, updating the parameters $R_o$, $R_p$ and $C_p$, and updating the first-order equivalent circuit model; and (A62) discretizing and transforming the updated first-order equivalent circuit model into the state space equations of $$x(k) = Ax(k-1) + BI_L(k-1)$$
$$y(k) = f(z(k)) + V_p(k) + R_o I_L(k)$$
$$A = \begin{bmatrix} e^{-\frac{\Delta t}{R_p C_p}} & 0 \\ 0 & 1 \end{bmatrix}, B = \left[\left(1 - e^{-\frac{\Delta t}{R_p C_p}}\right)R_p \quad \frac{\Delta t}{C_n}\right]^T$$
$$f(z(k)) = \sum_{i=0}^{n_p} c_i z^i(k),$$

wherein $x(k)=[V_p(k)\ z(k)]^T$ represents state vector to be estimated at time k; obviously, x(k−1) represents state vector to be estimated at time k−1, $y(k)=V_t(k)$ represents system output, $\Delta t$ represents calculated time step of cell management unit, A represents state transition matrix, B represents coefficient matrix of $I_L$, $V_p(k)$ represents polarization voltage at time k, $I_L(k)$ represents load current at time k, $f(z(k))$ represents OCV calculation function, $$\sum_{i=0}^{n_p} c_i z^i(k)$$

represents the SOC-OCV relationship obtained by polynomial fitting;

(A63) setting the state vector by a formula of $\hat{x}_{k-n}=[\hat{V}_p(k-n)\ \hat{z}(k-n)]^T$, setting an extended decision vector to be estimated by a formula of $\hat{\theta}_{k-n}=[\hat{x}_{k-n}^T\ \hat{I}_L(k-n)]^T$, and then based on the state space equations obtained by the step (A62), constructing a constrained optimization problem that minimizes a terminal voltage error within a customized time window by a formula of $$\{\hat{\theta}\}_{i=k-n}^{k} = \arg\min_{\{\hat{\theta}\}_{i=k-n}^{k}} \|\alpha(\hat{x}_{k-n} - \bar{x}_{k-n})\|_2 + \sum_{i=k-n}^{k} |\hat{V}_{t,i} - V_{t,i}|,$$

which is subject to the state space equations, $$\{\hat{\theta}\}_{i=k-n}^{k} = [\hat{\theta}_{k-n} \ \hat{\theta}_{k-n+1} \ \ldots \ \hat{Q}_k]$$

$$\{\hat{x}\}_{i=k-n}^{k} = [\hat{x}_{k-n} \ \hat{x}_{k-n+1} \ \ldots \ \hat{x}_k]$$

$$\bar{x}_{k-n} = A\hat{x}_{k-n-1} + BI_{L,k-n-1}, \alpha = \begin{bmatrix} \alpha_1 & 0 \\ 0 & \alpha_2 \end{bmatrix}$$

here, $V_{t,i}$ represents open circuit terminal voltage measurement value at time i, $\hat{V}_{t,i}$ represents open circuit terminal voltage estimated value at time i, $\hat{x}_{k-n}$ represents estimated value of state vector at time k−n, n represents customized rolling time domain window length and is preferably 1<n<5 (such as n=3), superscript "^" represents true quantity estimated value, $|\bullet|_2$ represents 2-norm, α represents weight matrix;

(A64) performing online estimation on the SOC and the input current by rolling time domain estimation method, which comprises:

converting the optimization problem with equality constraints into an optimization problem without constraints, and then solving the optimization problem without constraints, wherein the conversion is realized by introducing the Lagrangian multiplier λ and constructing a Lagrangian function, the solution is realized by numerical methods such as maximum gradient method, Newton method, trust region method and conjugate gradient method.

Constructing the Lagrangian function and solving by Newton method are explained in detail as follows.

Setting an optimization objective function of the optimization problem with equality constraints by a formula of $$g(\{\hat{\theta}\}_{i=k-n}^{k}) = \|\alpha(\hat{x}_{k-n} - \bar{x}_{k-n})\|_2 + \sum_{i=k-n}^{k} |\hat{V}_{t,i} - V_{t,i}|,$$

wherein a constraint condition is $h(\{\hat{\theta}\}_{i=k-n}^{k})=0$, here, g(•) represents the optimization objective function, h(•) represents the constraint condition.

A conversion of the optimization objective function is expressed by formulas of $$\arg\min_{\bar{\theta}} G(\bar{\theta}) = g(\{\hat{\theta}\}_{i=k-n}^{k}) + \lambda h(\{\hat{\theta}\}_{i=k-n}^{k})$$

$$\bar{\theta} = \begin{bmatrix} \{\hat{\theta}\}_{i=k-n}^{k} \\ \lambda \end{bmatrix},$$

here, G represents an optimization objective function after introducing Lagrangian function, $\bar{\theta}$ represents augmented decision vector after introducing Lagrangian function.

Performing a second-order Taylor expansion on $G(\bar{\theta})$ as follows.

$$G(\bar{\theta}+\Delta\bar{\theta})=G(\bar{\theta})+G'(\bar{\theta})^T\Delta\bar{\theta}+\tfrac{1}{2}\Delta\bar{\theta}^T G''(\bar{\theta})\Delta\bar{\theta},$$

here, second derivative $G''(\bar{\theta})$ is Hessian matrix as follows.

$$G''(\bar{\theta}) = H = \begin{bmatrix} \frac{\partial^2 G}{\partial \bar{\theta}_1^2} & \frac{\partial^2 G}{\partial \bar{\theta}_1 \partial \bar{\theta}_2} & \cdots & \frac{\partial^2 G}{\partial \bar{\theta}_1 \partial \theta_n} \\ \frac{\partial^2 G}{\partial \bar{\theta}_2 \partial \bar{\theta}_1} & \frac{\partial^2 G}{\partial \bar{\theta}_2^2} & \cdots & \frac{\partial^2 G}{\partial \bar{\theta}_2 \partial \bar{\theta}_n} \\ \vdots & \vdots & \ddots & \vdots \\ \frac{\partial^2 G}{\partial \bar{\theta}_n \partial \bar{\theta}_1} & \frac{\partial^2 G}{\partial \bar{\theta}_n \partial \bar{\theta}_2} & \cdots & \frac{\partial^2 G}{\partial \bar{\theta}_n^2} \end{bmatrix},$$

Deriving $\Delta\bar{\theta}$ with the second-order Taylor expansion of $G(\bar{\theta})$ and making it 0, so that a formula is obtained as follows.

$$G'(\bar{\theta})^T + H\Delta\bar{\theta} = 0 \Rightarrow \Delta\bar{\theta} = -H^{-1}G'(\bar{\theta})^T,$$

so that an iterative formula of optimal solution is $$\bar{\theta}(k+1) = \bar{\theta}(k) - H^{-1}G'(\bar{\theta}(k))^T \nabla G(\bar{\theta}(k)),$$

here, $\nabla G(\bar{\theta}(k))$ represents gradient of $G(\bar{\theta})$ at $\bar{\theta}(k)$.

By constructing the constrained optimization problem as described above and solving iteratively, the real-time estimates of the SOC and the input current at the current moment are obtained.

(A7) Based on the estimation model and the mapping relationship of between parameters and battery data, obtaining model parameters of next moment and a new real-time estimate of the SOC through the step of (A6).

First Embodiment

According to the first embodiment of the present invention, the battery cell of the intelligent battery is embodied as a lithium ion battery with 2.6 Ah nominal capacity; the temperature sensor is embodied as a thermal resistor, wherein the measuring points are the surface of the printed circuit board (PCB) and the surface of the battery cell; the integrated multiplexing analog-digital converter (ADC) is connected with the positive and negative electrodes of the battery cell, and the output end of the thermal resistor through two channels, respectively; the output end of the sensor interface circuit is connected with the controller module of the cell management unit through the serial peripheral interface of the ADC; the voltage acquisition interval is in a range of 10 ms to 100 ms; the switching device is embodied as a power metal-oxide-semiconductor field-effect transistor (power MOSFET).

The equivalent circuit model of the intelligent battery is the first-order RC (resistor-capacitor) model.

During the SOC-OCV test, both the charging rate and the discharging rate are 0.3 C, the charge amplitude during charging or the discharge amplitude during discharging is 10% SOC, and each standing time is 2 h.

According to the first embodiment of the present invention, the step (A4) specifically comprises (under the test condition of 25° C.):

(A41) charging the intelligent battery till 100% full through CCCV charging mode, wherein the constant current charging rate is 0.3 C, the upper cut-off voltage is 4.2 V, the constant voltage cut-off current is 0.05 C;

(A42) standing the intelligent battery still, applying the hybrid power pulse test current to the intelligent battery and testing the current-voltage response data thereof, wherein applying the hybrid power pulse test current to the intelligent battery comprises:

discharging at 4 C of the hybrid power pulse test current for 10 s, and then standing still for 40 s, and then charging at 4 C of the hybrid power pulse test current for 10 s, and finally standing still for 40 s, wherein during applying the hybrid power pulse test current to the intelligent battery, if the battery terminal voltage exceeds the upper cut-off voltage or decreases to the lower cut-off voltage, discharging at 4 C of the hybrid power pulse test current or charging at 4 C of the hybrid power pulse test current is stopped immediately, standing still for 40 s is directly performed, both the current and voltage sampling frequencies are 1 Hz; and (A43) discharging the intelligent battery at 0.3 C of the constant current till the SOC thereof is decreased by 10%, stopping discharging, standing still, repeating applying the hybrid power pulse test current to the intelligent battery till during discharging the intelligent battery at 0.3 C of the constant current, the battery terminal voltage decreases to the lower cut-off voltage which is embodied as 3 V.

The intelligent battery is performed charge-discharge cycles at 2 C of the constant current, a capacity calibration test and a hybrid pulse test every 30 charge-discharge cycles are performed, wherein the capacity calibration test comprises fully charging the intelligent battery through the CCCV charging mode in the step (A41), discharging at 0.3 C of the constant current till the lower cut-off voltage is 3 V, calculating the released capacity during discharging through Ampere hour integration method, and calibrating the ratio of the obtained capacity to the initial nominal capacity of the intelligent battery as the current aging state; the hybrid impulse test is described in the steps (A41) to (A43). The above processes are repeated till the capacity of the intelligent battery decays to 80% of the initial nominal capacity and then stopped.

Another two sets of parallel experiments under the test conditions of 0° C. and 45° C. are performed, respectively, and the above test steps are repeated to collect data.

The customized rolling time domain window length n is equal to 3, and weight matrix α is the identity matrix.

Figure 5:
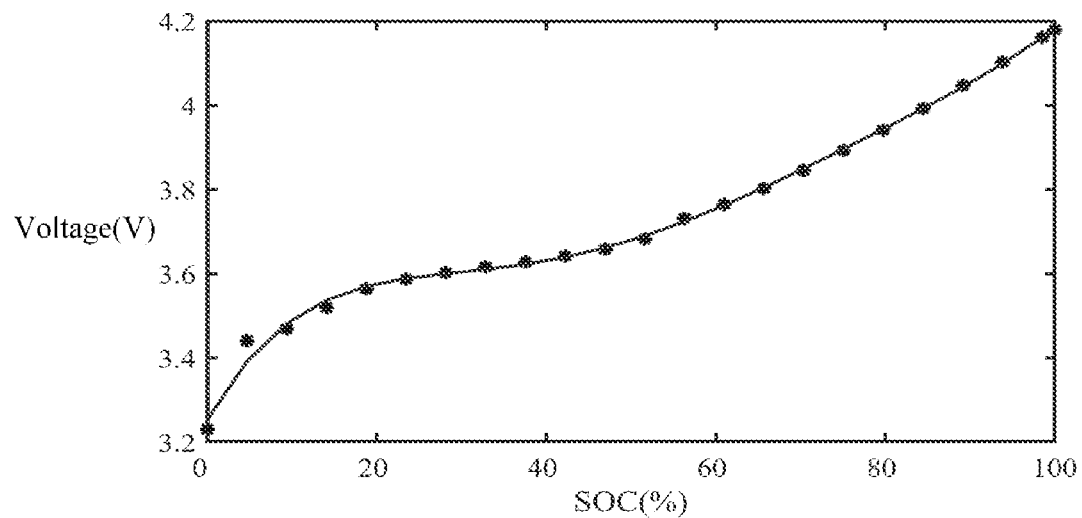
FIG. 5 is a SOC-OCV fitting curve graph according to a first embodiment of the present invention.

The SOC-OCV fitting formula of the intelligent battery is obtained by the polynomial fitting method mentioned above, and results thereof are shown in FIG. 5.

The real-time estimates of the intelligent battery are obtained by constructing Lagrange function and solving with Newton method mentioned above.

Figure 6:
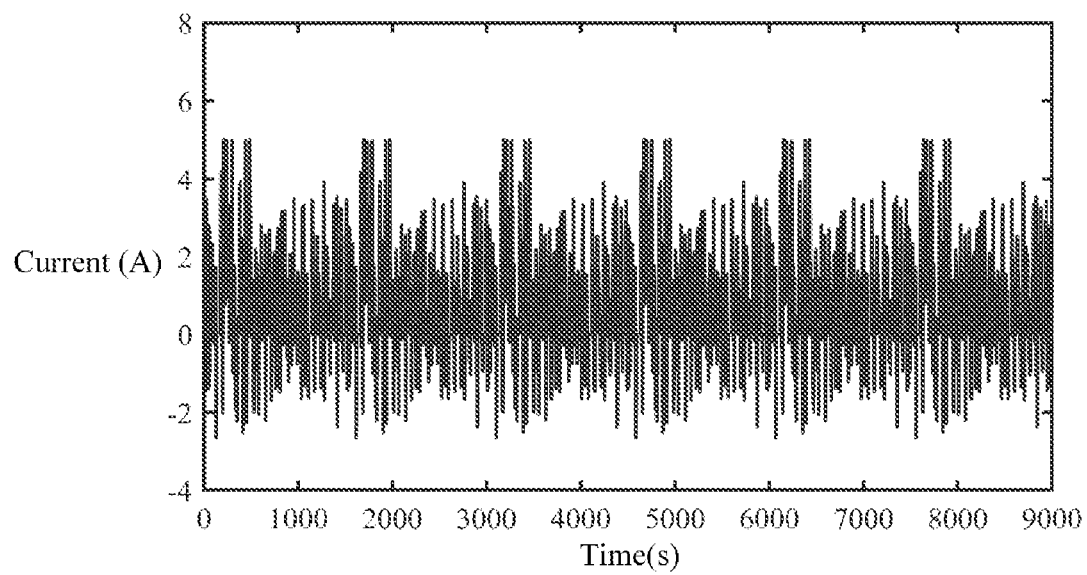
FIG. 6 shows current values under federal urban driving schedule (FUDS) working conditions according to the first embodiment of the present invention.
Figure 7:
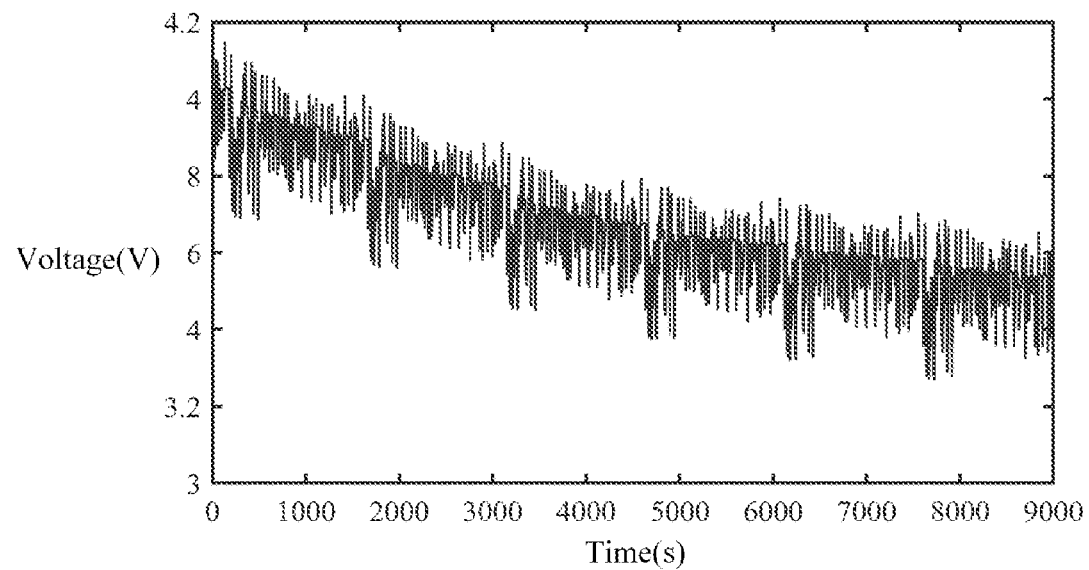
FIG. 7 shows battery terminal voltages under FUDS working conditions according to the first embodiment of the present invention.
Figure 8:
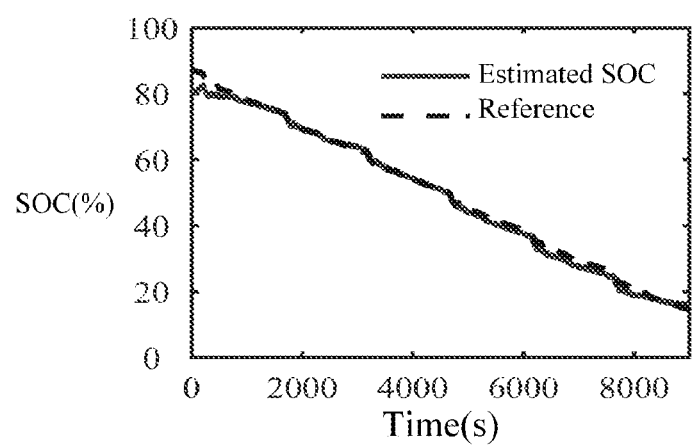
FIG. 8 shows SOC online estimation results under FUDS working conditions according to the first embodiment of the present invention.
Figure 9:
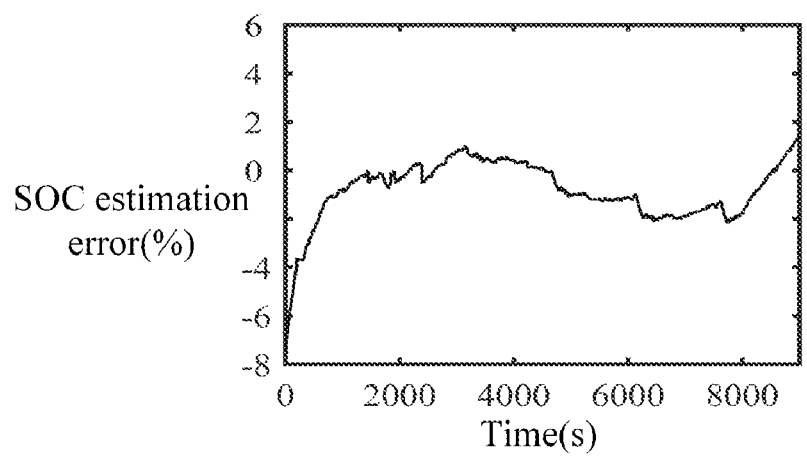
FIG. 9 shows SOC estimation error results under FUDS working conditions according to the first embodiment of the present invention.

The FUDS operating condition test is performed on the intelligent battery at room temperature, and the current and terminal voltage curves obtained under FUDS working conditions are shown in FIGS. 6 to 7, and the SOC estimation results and estimation errors are shown in FIGS. 8 to 9. FIG. 8 shows the SOC estimation results. FIG. 9 shows the SOC estimation errors. It is able to be seen that the estimated root mean square error is 1.48%, and the maximum error does not exceed 2%. Obviously, the SOC estimation method provided by the present invention is still able to maintain a high SOC estimation accuracy without current sensor, and the intelligent battery without current sensor provided by the present invention has the SOC self-diagnosis function.

The above embodiment is only the preferred embodiment of the present invention, and the protection scope of the present invention is not limited to the above embodiment. All technical solutions under the idea of the present invention belong to the protection scope of the present invention. It should be pointed out that for those skilled in the art, improvements and modifications without departing from the principle of the present invention should also fall within the protection scope of the present invention.

What is claimed is:

1. A state-of-charge (SOC) online estimation method of an intelligent battery, the method comprising steps of:
   obtaining an equivalent circuit model with undetermined parameters of the intelligent battery;
   obtaining SOC-OCV (open circuit voltage) relationship of the intelligent battery;
   obtaining current-voltage relationship of the intelligent battery under different working conditions;
   based on the SOC-OCV relationship and the current-voltage relationship, obtaining a mapping relationship between the undetermined parameters and the working conditions of the intelligent battery;
   based on the mapping relationship, obtaining an equivalent circuit model with calibrated parameters after fitting; and
   based on the equivalent circuit model with the calibrated parameters, according to a current battery terminal voltage and a current battery temperature, through a joint estimation of state space equation and rolling time domain optimization, obtaining real-time estimates of the SOC.

2. The SOC online estimation method according to claim 1, wherein the equivalent circuit model with the undetermined parameters of the intelligent battery is first-order RC (resistor-capacitor) model, second-order RC model, internal resistance equivalent model, Partnership for a New Generation of Vehicles (PNGV) model or electrochemical model.

3. The SOC online estimation method according to claim 2, wherein the equivalent circuit model with the undetermined parameters of the intelligent battery is the first-order RC model which is expressed by formulas of:

$$C_p dV_p(t)/dt + V_p(t)/R_p = I_L(t)$$

$$V_t(t) = V_{oc}(t) - V_p(t) - I_L(t)R_o$$

$$dz(t)/dt = -\eta I_L(t)/C_n,$$

here, t represents time, $I_L$ represents load current, $I_L(t)$ represents load current at time t, $V_p$ represents polarization voltage, $V_p(t)$ represents polarization voltage at time t, $V_t$ represents terminal voltage, and $V_t(t)$ represents terminal voltage at time t, η represents Coulomb efficiency of intelligent battery, $C_n$ represents rated capacity of intelligent battery, $R_o$, $R_p$ and $C_p$ respectively represent ohmic internal resistance parameter, polarization resistance parameter and polarization capacitance parameter to be determined, $V_{oc}$ represents open circuit voltage of intelligent battery OCV, $V_{oc}(t)$ represents OCV of intelligent battery at time t, z represents SOC of intelligent battery, and then dz(t)/dt represents derivative of SOC of intelligent battery with respect to time.

4. The SOC online estimation method according to claim 1, wherein the SOC-OCV relationship is obtained by measuring a battery terminal voltage in different charging and discharging stages, taking the battery terminal voltage as an OCV in different charging and discharging stages, matching the OCV with a SOC of the intelligent battery at a same time obtained by Ampere hour integration method, respectively obtaining SOC-OCV data during charging and SOC-OCV data during discharging, so that based on the SOC-OCV data during charging and the SOC-OCV data during discharging, or averaged SOC-OCV data during charging or averaged SOC-OCV data during discharging, the SOC-OCV relationship is obtained through polynomial fitting.

5. The SOC online estimation method according to claim 1, wherein at least one of the current-voltage relationship and the mapping relationship between the undetermined parameters and the battery working conditions of the intelligent battery is obtained by a hybrid pulse power characteristic (HPPC) test of the intelligent battery under different working conditions, wherein the working conditions are SOC, battery temperature and battery aging state.

6. The SOC online estimation method according to claim 1, wherein the joint estimation method comprises steps of:
(1) discretizing and transforming the equivalent circuit model with calibrated parameters into state space equations of $$x(k) = Ax(k-1) + BI_L(k-1)$$

$$y(k) = f(z(k)) + V_p(k) + R_o I_L(k)$$

$$A = \begin{bmatrix} e^{-\frac{\Delta t}{R_p C_p}} & 0 \\ 0 & 1 \end{bmatrix}, B = \left[ \left(1 - e^{-\frac{\Delta t}{R_p C_p}}\right) R_p \quad \frac{\Delta t}{C_n} \right]^T$$

$$f(z(k)) = \sum_{i=0}^{n_p} c_i z^i(k),$$

wherein $x(k)=[V_p(k) \ z(k)]^T$ represents state vector to be estimated at time k, $x(k-1)$ represents state vector to be estimated at time k−1, $y(k)=V_t(k)$ represents system output, $\Delta t$ represents calculated time step of cell management unit, A represents state transition matrix, B represents coefficient matrix of $I_L$, $V_p(k)$ represents polarization voltage at time k, $I_L(k)$ represents load current at time k, $f(z(k))$ represents OCV calculation function, $$\sum_{i=0}^{n_p} c_i z^i(k)$$

represents the SOC-OCV relationship obtained by polynomial fitting;
(2) based on the state space equations, constructing a constrained optimization problem that minimizes a terminal voltage error within a customized time window, and online estimating the SOC and the input current through rolling time domain optimization, wherein the constrained optimization problem and constraint conditions thereof are expressed by formulas of $$\{\hat{\theta}\}_{i=k-n}^{k} = \arg \min_{\{\hat{\theta}\}_{i=k-n}^{k}} \|\alpha(\hat{x}_{k-n} - \bar{x}_{k-n})\|_2 + \sum_{i=k-n}^{k} |\hat{V}_{t,i} - V_{t,i}|,$$

which is subject to the state space equations, $$\{\hat{\theta}\}_{i=k-n}^{k} = \begin{bmatrix} \hat{\theta}_{k-n} & \hat{\theta}_{k-n+1} & \dots & \hat{Q}_k \end{bmatrix}$$

$$\{\hat{x}\}_{i=k-n}^{k} = \begin{bmatrix} \hat{x}_{k-n} & \hat{x}_{k-n+1} & \dots & \hat{x}_k \end{bmatrix}$$

$$\bar{x}_{k-n} = A\hat{x}_{k-n-1} + BI_{L,k-n-1}, \alpha = \begin{bmatrix} \alpha_1 & 0 \\ 0 & \alpha_2 \end{bmatrix},$$

here, $V_{t,i}$ represents open circuit terminal voltage measurement value at time i, $\hat{V}_{t,i}$ represents open circuit terminal voltage estimated value at time i, $\hat{x}_{k-n}$ represents state vector estimated value at time k−n, n represents customized rolling time domain window length, superscript "^" represents true quantity estimated value, $|\bullet|_2$ represents 2-norm, α represents weight matrix.

7. The SOC online estimation method according to claim 6, wherein solving the constrained optimization problem comprises converting the constrained optimization problem into an optimization problem without constraints, obtaining an optimization objective function, and solving the optimization objective function.

* * * * *